United States Patent

McCollough et al.

[11] Patent Number: 5,404,386
[45] Date of Patent: Apr. 4, 1995

[54] PROGRAMMABLE CLOCK FOR AN ANALOG CONVERTER IN A DATA PROCESSOR AND METHOD THEREFOR

[75] Inventors: Kelvin E. McCollough; Jules D. Campbell, Jr.; Colleen M. Collins; Cheri L. Harrington, all of Austin, Tex.

[73] Assignee: Motorola, Inc., Schaumburg, Ill.

[21] Appl. No.: 157,245

[22] Filed: Nov. 26, 1993

[51] Int. Cl.[6] ............... H03K 21/02; H03K 23/66
[52] U.S. Cl. ........................... 377/55; 377/42; 377/52; 327/175; 327/291
[58] Field of Search ............ 377/42, 52, 55; 307/265, 269

[56] References Cited

U.S. PATENT DOCUMENTS

| | | |
|---|---|---|
| 4,389,637 | 6/1983 | Rzeszewski, III ........ 340/347 DA |
| 4,567,466 | 1/1986 | Bozarth et al. ............ 340/347 AD |
| 4,685,614 | 8/1987 | Levine ........................ 377/42 |
| 5,045,715 | 9/1991 | Fitch ........................... 307/269 |

Primary Examiner—Margaret Rose Wambach
Attorney, Agent, or Firm—Elizabeth A. Apperley

[57] ABSTRACT

A data processing system (10) includes a programmable clock signal for an analog converter (28). A duty cycle of the programmable clock signal is programmed by an external user in a prescaler rate selection register (16). A counter subsequently counts for a first period of time corresponding to a phase in which the programmable clock signal is asserted. The counter then counts for a second period of time corresponding to a phase in which the programmable clock signal is negated. By allowing the user to program and modify the duty cycle of the programmable clock signal, the performance of the analog converter (28) may be optimized without constraining the requirements of an external system clock.

16 Claims, 2 Drawing Sheets

PROGRAMMABLE CLOCK FOR AN ANALOG CONVERTER IN A DATA PROCESSOR AND METHOD THEREFOR

FIELD OF THE INVENTION

This invention relates generally to a clock in a data processor, and more particularly to a clock for use with an analog converter in a data processor.

BACKGROUND OF THE INVENTION

Since the dawning of the digital computing era, clock generation systems have continuously evolved. Examples of such clock generation systems include: high-speed, multiphased clocking systems for efficient computing engines, non-overlapping control clocks for time critical operations, stable high-speed clocks for communication systems, and multiple duty cycle system clock generators for pulse width modulation and control applications. It should be understood that a duty cycle is calculated as a high time of the system clock divided by a period of the system clock. As a result of the introduction of mixed signal data processing systems, clock generation system requirements continue to increase in complexity. For example, modern mixed-signal data processing integrated circuit chips (known as "micro controllers") include a versatile composite of digital and analog subsystems which are required to coexist and to utilize a common system clock. The coexistence of the digital and analog subsystems mandates the growth of distinctly different clocking schemes within a common integrated environment.

Since each of these individual analog and digital subsystems functions within its own operating parameters, each may require a clock distinctly different from the main system clock. For example, Motorola's MCHC16Z1 analog-to-digital converter (A/D) module utilizes a user programmable prescaled system clock to produce a 50% duty cycle clock for usage by the A/D converter module. It is a unique and useful implementation for deriving an A/D converter clock from a much higher system clock frequency. By prescaling the system clock with a 5 bit modulus counter and passing it through an additional fixed divide by 2 circuit, a 50% duty cycle clock is always generated for usage by the A/D converter module. However, aside from defining operational boundary conditions conveniently, a fixed 50% duty cycle may not optimize either an analog or digital subsystem's performance.

Another distinctly different application in which a system clock on a microcontroller is modified specifically for usage by an internal subsystem is a variable duty cycle clock generator. Variable duty cycle clock generators or pulse width modulation circuits are popular for control of external time critical events.

In a data processing system component, such as an analog to digital converter, a first operation occurring on a first clock phase may require a different execution time than a second operation occurring on a second clock phase. In such a component, performance of the data processing system is limited by the existence of a fixed duty cycle clock because the frequency and duty cycle provided to the component must accomodate the slowest operation executed by that component. Therefore, a need exists for a method for modifying the clock frequency and duty cycle to reflect the operations currently executed by the component.

SUMMARY OF THE INVENTION

The previously mentioned needs are fulfilled with the present invention. Accordingly, there is provided, in a first form, a method for providing a programmable clock signal to an analog converter. The method includes the step of programming a high time value in a first portion of a register. A low time value is programmed in a second portion of the register. A programmable clock signal is then asserted. A counter is enabled to count to the high time value. The programmable clock signal is negated when the counter equals the high time value. The counter is enabled to count to the low time value. The programmable clock signal is asserted when the counter equals the low time value. The analog converter is enabled to perform a first operation when the programmable clock signal is asserted. The analog converter is enabled to perform a second operation when the programmable clock signal is negated.

In an alternate embodiment, the present invention provides a data processing system. The data processing system includes a register circuit for storing a high count value and a low count value. A counter has a first input coupled to the register circuit for receiving one of the high count value and the low count value. The counter has a second input for receiving a system clock signal. The counter decrements an intermediate count value stored therein in response to the system clock signal. A detect circuit is connected to the counter for receiving the intermediate count value. The detect circuit asserts a detect signal when the count value is equal to zero. A driver circuit is connected to the detect circuit for receiving the detect signal. The driver circuit selectively asserts a converter clock signal in response to the detect signal. An analog converter is connected to the driver circuit for receiving the converter clock signal. The analog converter performs a conversion operation in response to the converter clock signal.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

Since the realization of mixed-signal data processing systems, analog subsystem performance has often been the limiting factor to a system's performance. One reason originates from the inherent weakness of a fixed 50% duty cycle clock as implemented in the example described earlier. Therefore, in the present invention, a clock generation system and a method for operating the clock generation system were developed to improve the performance of a data processing system by creating a clock generation system which maximized an analog subsystem's performance.

In the present embodiment of the invention, a clock generation system which addresses the need to maximize an analog subsystem's performance has been implemented on a microcontroller. To accommodate the wide variations of a main microcontroller system clock frequency, a clock designed to drive an analog subsystem is generated by a programmable prescaler which scales the system clock to operate at an optimum frequency as specified by the analog subsystem's operational requirements.

Furthermore, to provide an optimal duty cycle across the spectrum of possible analog subsystem clock frequencies, the duty cycle of the generated clock is programmable. Provision is made via a control register to determine both a high and a low phase of the generated clock. An upper bit field is utilized to specify the high phase of the generated clock, a lower bit field is utilized to specify the low phase of the generated clock, and a single bit is dedicated to adding a half system clock cycle to the high phase while simultaneously subtracting a half system clock cycle from the low phase. The single bit function provides additional granularity to the duty cycle. The combination of the upper and lower bit fields in the control register establishes the frequency of the generated clock.

DESCRIPTION OF CONNECTIVITY

Figure 1:
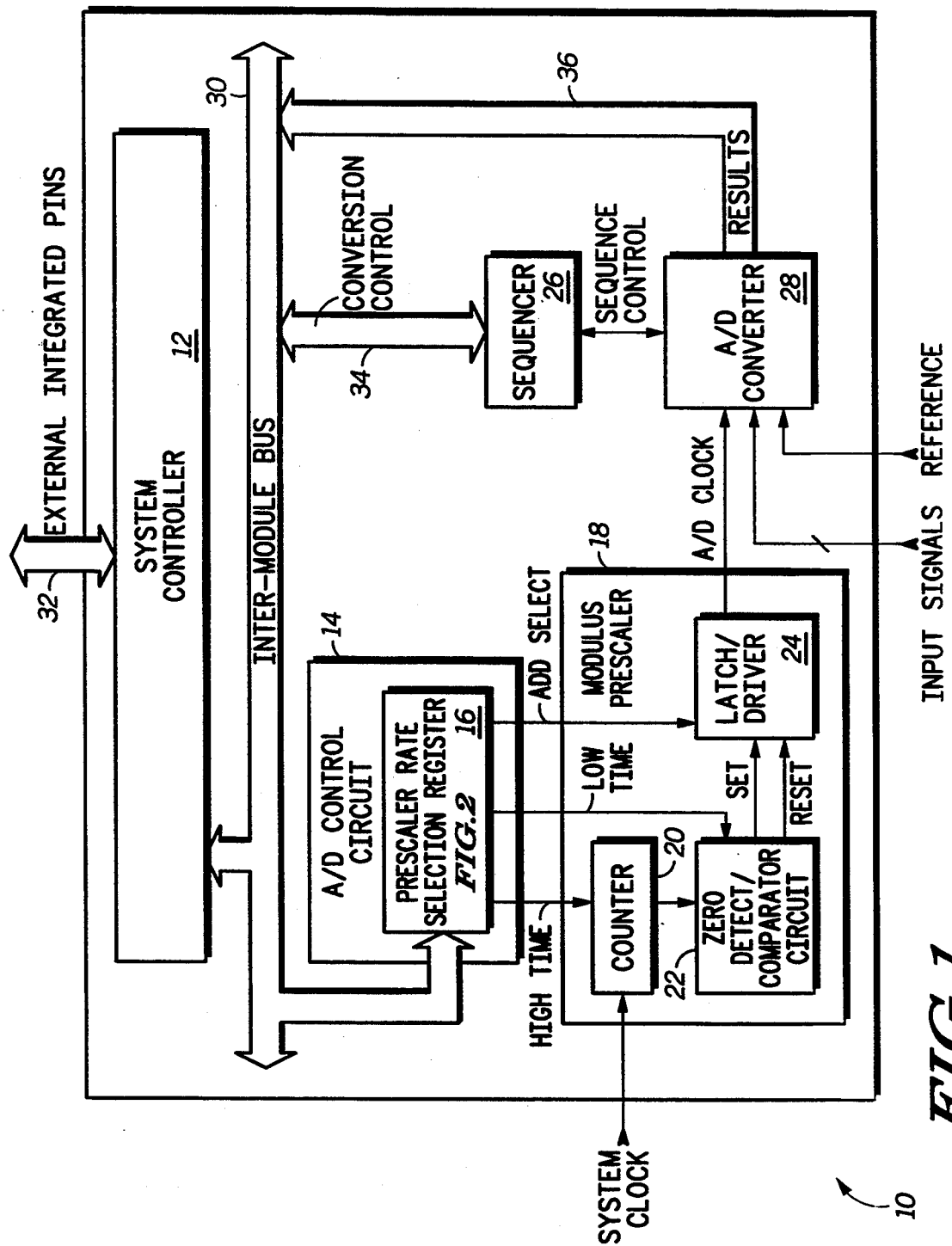
FIG. 1 illustrates in block diagram form a first embodiment of a data processing system having a clock generation circuit in accordance with the present invention.

FIG. 1 illustrates a first embodiment of a data processing system 10 in accordance with the present invention. Data processing system 10 includes a system controller 12, an analog to digital (A/D) control circuit 14, a prescaler rate selection register 16, a modulus prescaler 18, a counter 20, a zero detect/comparator circuit 22, a latch/driver circuit 24, a sequencer 26, and an analog to digital (A/D) converter 28.

A plurality of external integrated circuit pins provide information to system controller 12 from an external user of data processing system 10. An Inter-Module bus 30 bidirectionally couples system controller 12 to A/D control circuit 14. Sequencer 26 is coupled to Inter-Module bus 30 via a Conversion Control bus 34. Prescaler rate selection register 16 is coupled to counter 20 of modulus prescaler 18 to provide a signal labeled "High Time". Counter 20 also receives a signal labeled "System Clock" provided by an external clock source (not shown herein). Prescaler rate selection register 16 also provides a signal labeled "Low Time" to an input of zero detect/comparator circuit 22 and a signal labeled "Add Select" to an input of latch/driver circuit 24. Zero detect/comparator circuit 22 is coupled to latch/driver circuit 24 to provide a Set signal and a Reset signal.

Modulus prescaler 18 provides a signal labeled "A/D Clock" to A/D converter 28. A/D converter 28 also receives a plurality of signals collectively labeled "Input Signals" and a signal labeled "Reference" from an external source. Additionally, sequencer 26 provides a plurality of bidirectional signals labeled "Sequence Control" to an input of A/D converter 28. A/D converter 28 provides a result to Inter-Module bus 30 via a Results bus 36 on demand.

Figure 2:
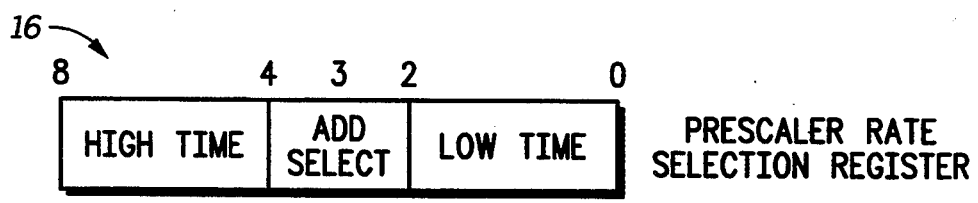
FIG. 2 illustrates in block diagram form a prescaler rate selection register of the data processing system of FIG. 1.

FIG. 2 illustrates in block diagram form prescaler rate register 16. Bits 0 through 2 indicate a low phase of the A/D Clock signal. Bits 4 through 8 indicate a high phase of the A/D Clock signal. Bit 3 is an add select bit which indicates whether a half a system clock cycle should be added to the high phase of the A/D Clock signal for increased granularity.

Figure 3:
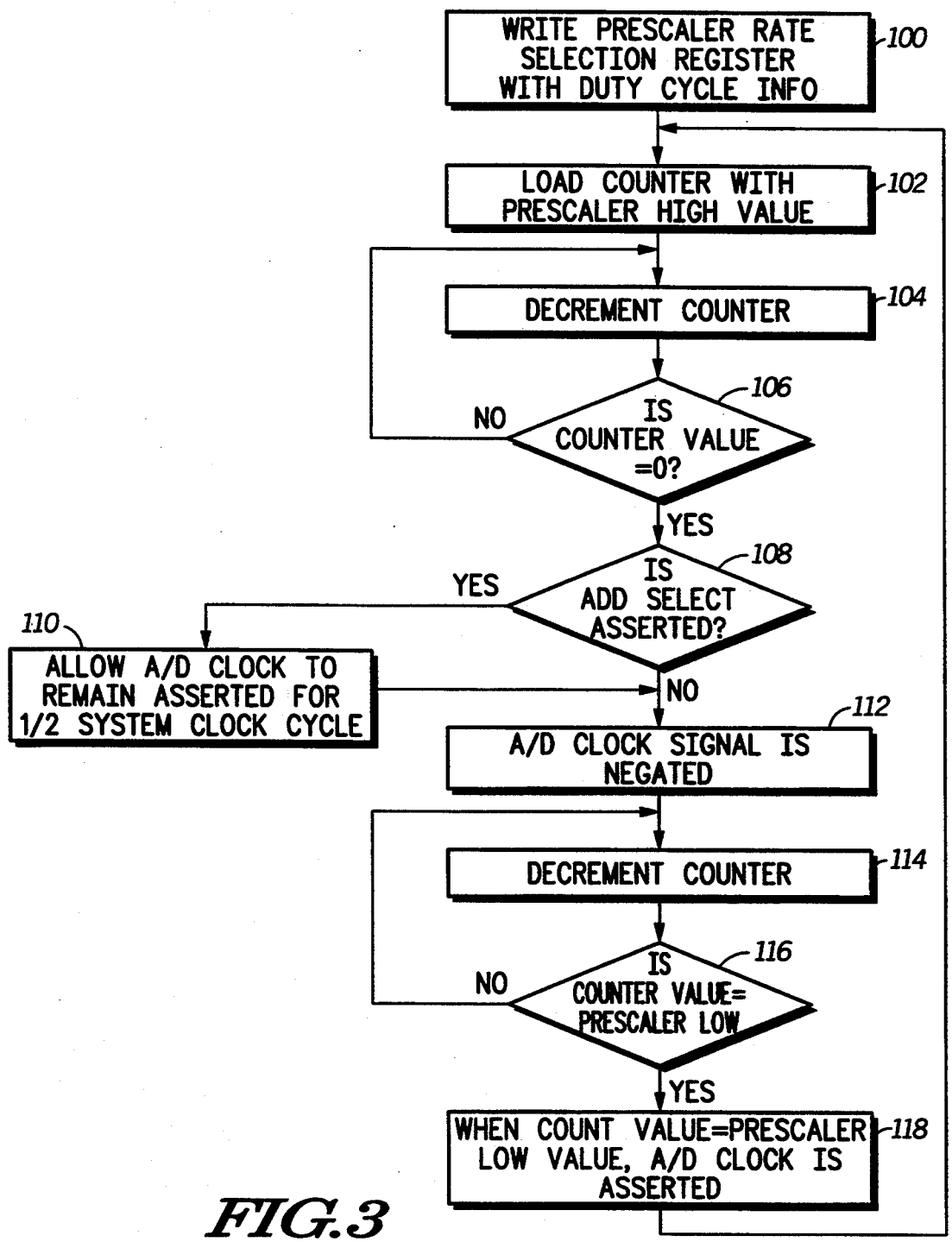
FIG. 3 provides a flow chart illustrating a method implemented by the clock generator circuit in accordance with the present invention.

FIG. 3 illustrates a flow chart of the method used to implement the preferred embodiment of the present invention. Box 100 indicates a first step in execution of the clock generation operation implemented by data processing system 10. In Box 100, the prescaler rate selection register 16 is written with duty cycle information. In Box 102, counter 20 is loaded with the value stored in the bits of prescaler rate selection register 16 which provide the high phase of the A/D Clock signal. Box 104 describes the steps of enabling counter 20 to decrement using the System Clock signal as a reference. At this point, the A/D Clock signal is asserted. In Box 106, the Reset signal is asserted by zero detect/comparator circuit 22 when the count provided by counter 20 is equal to zero. In Box 108, the add select bit of prescaler rate selection register 16 is tested to determine if it is asserted. If the add select bit is asserted, the A/D Clock signal remains asserted for an additional half of the System Clock signal cycle (Box 110). The A/D clock signal is subsequently negated (Box 112). Additionally, if the add select bit is negated, the A/D clock signal is immediately negated (Box 112). Counter 20 continues to decrement (Box 114) and compares the count value stored therein with the value stored in the bits of prescaler rate selection register 16 which provide the low phase of the A/D Clock signal (Box 116). When the count value is equal to the bits in prescaler rate selection register 16 corresponding to the low phase of the A/D Clock signal, the A/D Clock signal is asserted by the Set signal from the zero detect/comparator circuit 22(Box 118).

Operation of each of the embodiment of the present invention will subsequently be discussed in more detail.

DESCRIPTION OF OPERATION

As previously mentioned, mixed signal systems such as microcontrollers often contain analog subsystems with distinctly differing clocking needs. In the prior art, A/D converters are known to use a scaled down system clock with a fixed 50% duty cycle to accommodate their different clock frequency needs. Although, these prescalers work quite well, the 50% duty cycle clock can restrict the maximum A/D clock frequency by approximately 33%-50% depending on the system clock frequency used.

The performance of an A/D converter is measured by the interrelated characteristics of its accuracy and its total conversion time. The total conversion time is the time required to perform an analog-to-digital conversion as determined by the total number of clock periods during the conversion process. Generally, given an uncorrupted input, the accuracy is dependent upon providing an adequate period of time for resolving a decision in a single cycle converter. Conversely, in a multiple cycle converter, accuracy is dependent upon sufficient resolving time for each cycle. The sum of this resolving time (often assigned the A/D clock high time) plus the time needed to convey the resolved decision (often assigned the A/D clock low time) determines the resolution time for an A/D converter. Minimum times for resolving a decision and conveying that information are inherent and, thus fixed for a given A/D converter design.

Therefore, for a desired accuracy, the minimum resolving time plus the minimum time to convey the decision determines the maximum A/D clock frequency which may be supported. The resolving time and the time needed to convey the result are typically not the same. Generally, the resolving time is greater than the time required for communicating the result. Consequently, previous A/D converter designs using a 50% duty cycle clock unnecessarily extended the conversion time. A 33%–50% extension of the conversion time may be directly attributable to the 50% duty cycle clock.

The present invention provides both a programmable prescaled system clock and a programmable duty cycle to allow the performance of an A/D converter to scale with expected system clock frequency improvements. To accomplish this, a clock generation system is provided for accommodating a wide range of system clock frequencies while maintaining maximum A/D converter performance.

As in prior art, for a 50% duty cycle, the fastest A/D converter clock frequency is generally determined by the product of an inherent minimum resolve time multiplied by two. Therefore, if the resolve time were 200 ns, then the fastest A/D converter clock frequency would be 2.5 MHz. Table 1 illustrates possible values for an A/D converter clock period based on four system clock frequencies and integer prescaler divisors of 2 to 10. Prescaled clock values which are less than or equal to the maximum A/D converter frequency appear below the solid black line. For example, given a system clock frequency of 16 MHz, the highest performance A/D converter clock frequency attainable would be 2.28 MHz using a divide by 7 prescaler. On the other hand, for a system clock frequency of 12 MHz, the highest performance A/D converter clock frequency attainable would be 2.4 MHz using a divide by 5 prescaler. The higher performance 2.4 MHz A/D converter operating frequency may be desirable in an application, but the system designer may not have the flexibility of using a 12 MHz system clock.

TABLE 1

| SYSTEM CLOCK DIVISORS | SYSTEM CLOCK FREQUENCY | | | |
|---|---|---|---|---|
| | 8 MHz | 12 MHz | 16 MHz | 20 MHz |
| divide by 2 | 250 ns | 167 ns | 125 ns | 100 ns |
| divide by 3 | 375 ns | 250 ns | 187 ns | 150 ns |
| divide by 4 | 500 ns | 333 ns | 250 ns | 200 ns |
| divide by 5 | 625 ns | 416 ns | 313 ns | 250 ns |
| divide by 6 | 750 ns | 500 ns | 375 ns | 300 ns |
| divide by 7 | 875 ns | 583 ns | 438 ns | 350 ns |
| divide by 8 | 1000 ns | 667 ns | 500 ns | 400 ns |
| divide by 9 | 1125 ns | 750 ns | 563 ns | 450 ns |
| divide by 10 | 1250 ns | 833 ns | 625 ns | 500 ns |

The reduced performance of prior art systems is due to the limited A/D converter clock frequencies available from a prescaler circuit and is compounded by the fact that the prescaler generates a 50% duty cycle. With a 50% duty cycle A/D converter clock, the maximum A/D converter clock frequency cannot be obtained since the actual resolving and communication of the result times are not the same. Even if the prescaler were able to provide the exact time needed to resolve a decision, time would be wasted during the communication of the decision.

In the present embodiment of the invention, the A/D converter clock high time provided by the prescaler circuit approximates the inherent minimum resolve time and the A/D converter clock low time approximates the inherent minimum time to convey the decision. The duty cycle is programmable to allow only the required high and low times to be generated by the prescaler. Therefore, the A/D converter clock frequency may be increased without losing accuracy.

For example, if the minimum resolve time were 200 ns and the minimum time to convey the decision were 100 ns and a 66% duty cycle were used, the theoretical maximum A/D converter clock frequency would be 3.3 MHz (refer again to Table 1). This would be a performance gain of 33% over the 2.5 MHz possible with a 50% duty cycle. The ratio of inherent resolve time to the time to convey the decision determines the actual performance gain that can be realized by optimizing the duty cycle. The greater the ratio, the greater the increase in performance of the data processing system.

Furthermore, technology is expected to increase performance without a complete redesign. For example, assume a prior art design incorporates a non-50% duty cycle clock to produce a fixed duty cycle that allows the A/D converter to realize its inherent minimum conversion time for the maximum system clock frequency specified for the device. Then, if the maximum system clock frequency were 16 MHz, a prescaler of 5 could be implemented with a 60% duty cycle. This would produce a maximum A/D converter clock frequency of 3.2 MHz. However, when the technology improvement occurs at some future time, the prior art approach would not allow the A/D converter to increase its performance as the system clock frequency increases. Instead, if the system clock frequency increased to 20 MHz, the A/D converter minimum resolution time decreases to 175 ns, and the minimum time to convey the decision decreases to 75 ns, the maximum inherent A/D converter clock frequency would become 4 MHz. A 70% duty cycle would then be required to allow the A/D converter to operate at 4 MHz. Therefore, if the duty cycle had been fixed at 60%, the maximum, realizable A/D converter frequency for a 20 MHz system clock would be 3.3 MHz.

The present embodiment of the invention optimizes an A/D converter's performance when integrated into a mixed-signal data processing system by providing a system and method of providing a scalable frequency from the main system clock frequency at a variable duty cycle. The present embodiment of the invention will now be described in more detail.

FIG. 1 illustrates data processing system 10 which implements a clock generation system for providing a programmable prescaled A/D converter clock frequency from a generic system clock frequency at a programmable duty cycle. The plurality of integrated circuit pins 32 provide a pathway for an external user to communicate a desired prescaler divisor and a duty cycle to system controller 12.

System controller 12 then communicates with other components of data processing system 10 via Inter-Module bus 30. Inter-Module Bus 30 is coupled to A/D control circuit 14 and prescaler rate selection register 16 to communicate data and associated control instructions. In the embodiment of the invention described herein, the prescaler divisor and information necessary to indicate the duty cycle desired by the user are transferred from system controller 12 to prescaler rate selection register 16 in A/D control circuit 14. It should be noted that the duty cycle is determined by a high value representing a high time phase of the A/D Clock signal and a low value representing a low time phase of the A/D Clock signal. Additionally, the high time phase may be extended by one half a system clock cycle. As will be subsequently discussed, the high value, the low value, and a bit to extend the high time phase are stored in appropriate bit locations in prescaler rate selection register 16.

FIG. 2 illustrates prescaler rate selection register 16 in more detail. To permit a wide selection of the system clock frequencies and associated duty cycles, prescaler rate selection register 16 is implemented with nine bits of programmability. Prescaler rate selection register 16 establishes the characteristics of the A/D Clock signal. Bits 4 through 8 define a high time in which the A/D Clock signal is asserted. Bit 3 defines an add select bit to indicate whether a half cycle of the System Clock signal should be added to the high time before the A/D Clock signal is negated. Bits 0 through 2 define a low time in which the A/D Clock signal is negated. All of the bit fields of prescaler rate selection register 16 as described herein may be written to and read from.

Once the external user has programmed prescaler rate selection register 16 with the appropriate values, bits 4 through 8 of register 16 provide the high time value to counter 20 via the High Time signal. Additionally, the A/D Clock signal is asserted after this time. Counter 20 subsequently begins decrementing the high time value by one each time the System Clock signal is asserted. Like the high time and low time values, the System Clock signal is provided by an external user via a crystal oscillator or some other clock frequency source.

When counter 20 has reached zero, zero detect/comparator circuit 22 provides an asserted Reset signal to latch/driver circuit 24. When the Reset signal is asserted, latch/driver circuit 24 simultaneously receives bit 3, the add select bit, of prescaler rate selection register 16, via the Add Select signal. Latch/driver circuit 24 uses the add select bit to determine if the A/D Clock signal should remain asserted for an additional period of time equal to half of the System Clock signal cycle. If the add select bit is asserted and the Reset signal is asserted, latch/driver circuit 24 waits for the period of time equal to half of the System Clock signal cycle and then negates the A/D Clock signal. If the add select bit is negated and the Reset signal is asserted, latch/driver circuit 24 negates the A/D Clock signal immediately.

When the A/D Clock signal is negated, the low time value stored in bits 0 through 2 of prescaler rate selection register 16 is provided to zero detect/comparator circuit 22 via the Low Time signal. Zero detect/comparator circuit 22 then performs a two's complement comparison to determine if the current count value is equal to the low time value. Counter 20 continues to decrement each time the System Clock signal is asserted. Therefore, after the high count value has been fully decremented, counter 20 counts using negative numbers. When counter 20 reaches a negative number corresponding to the low time value, a comparator (not shown in detail) in zero detect/comparator circuit 22 compares the two values and subsequently asserts the Set signal. Upon receipt of the asserted Set signal, latch/driver circuit 24 asserts the A/D Clock signal. Counter 20 is then loaded with the high time value and the process begins again.

While the A/D Clock signal is high, A/D converter 28 uses each of the plurality of Input signals, the Reference signal, the Sequence Control signal and the A/D Clock signal to generate a result. Subsequently, when the A/D Clock signal is negated, A/D converter 28 transfers the result to Results bus 36. Results bus 36 then provides the result to another portion of data processing system 10 via Inter-Module bus 30. It should be well known to one with ordinary skill in the art that a register or a memory may be used to store the results of several conversion operations until an appropriate point in time. In such a configuration, a memory and an interface circuit receive the results from Results bus 36 and provide the results to Inter-Module bus 30.

Furthermore, it should be understood that operation of A/D converter 28 is controlled by sequencer 26 via the plurality of Sequence Control signals. Sequencer 26 receives operation information from system controller 12 via the Inter-Module Bus 30 and the Conversion Control bus 34. The functions performed by sequencer 26 and A/D converter 28 should be well known to one with ordinary skill in the art and will not be explained in more detail herein.

Operation of the system described above is summarized by FIG. 3. Box 100 indicates a first step in execution of the clock generation operation in which the prescaler rate selection register 16 is written with duty cycle information. Counter 20 is loaded with the value stored in the bits of prescaler rate selection register 16 which provide the high phase of the A/D Clock signal (Box 102). Box 104 describes the steps of enabling counter 20 to count down using the System Clock signal as a reference. At this point, the A/D Clock signal is asserted. In Box 106, the Reset signal is asserted by zero detect/comparator circuit 22 when the count provided by counter 20 is equal to zero. In Box 108, the add select bit of prescaler rate selection register 16 is tested to determine if it is asserted. If the add select bit is asserted, the A/D Clock signal remains asserted for an additional half of the System Clock signal cycle (Box 110). The A/D clock signal is subsequently negated (Box 112). Otherwise, if the add select bit is negated, the A/D clock signal is immediately negated (Box 112). Counter 20 continues to count negatively (Box 114) and compares the count value stored therein with the value stored in the bits of prescaler rate selection register 16 which provide the low phase of the A/D Clock signal (Box 116). When the count value is equal to the two's complement of the bits in prescaler rate selection register 16 corresponding to the low phase of the A/D Clock signal, the A/D Clock signal is asserted.

The clock generation circuit described herein provides a flexible and unique solution for providing clock signals to an analog converter. By allowing the duty cycle to be programmed, the analog converter may be operated at a higher frequency. By using high bits to indicate a high period of time, low bits to indicate a low period of time, and the add select bit to extend the high period of time for one-half a system clock cycle, the duty cycle of the clock signal provided to the analog converter may be chosen to optimize the performance of the analog converter. Therefore, the analog converter will be able to generate results and provide those results to an external user more quickly.

The implementation of the invention described herein is provided by way of example only. However, many other implementations may exist for executing the function described herein. For example, A/D converter 28 may be implemented as an SAR type converter. Alternatively, a digital to analog converter may also be used in the implementation of the invention described herein. Additionally, prescaler rate selection register 16 may include more bits such that the high time and the low time may be greater if so needed by the designer of the system. Conversely, prescaler rate selection register 16 may include fewer bits such that the high time and the low time may be less in value.

Additionally, it should be understood that the add select bit may be excluded from a system using the programmable clock disclosed herein. The add select bit is disclosed herein to illustrate the flexibility of the programmable clock in the present data processing system. Furthermore, the period or pulse width of the A/D clock signal may be programmed by a user of the system. The high and low time periods might also be generated by using an analog circuit.

It should also be understood that while the counter disclosed herein functions as a decrementer, the counter could increment to the high and low time values. Additionally, two separate counters may be used for counting to each of the high and low time values. Alternatively, a single down-up counter which decrements to zero to indicate the high time period and then increments to a positive number to indicate the low time period could be used.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A method for providing a programmable clock signal to an analog converter, comprising the steps of:
   programming a high time value in a first portion of a register;
   programming a low time value in a second portion of the register;
   asserting the programmable clock signal;
   enabling a counter to count to the high time value;
   negating the programmable clock signal when the counter equals the high time value;
   enabling the counter to count to the low time value;
   asserting the programmable clock signal when the counter equals the low time value;
   enabling the analog converter to perform a first operation when the programmable clock signal is asserted; and
   enabling the analog converter to perform a second operation when the programmable clock signal is negated.

2. The method of claim 1 wherein the high time value corresponds to a high time period.

3. The method of claim 1 wherein the low time value corresponds to a low time period.

4. The method of claim 1 wherein the first operation is a comparison operation.

5. The method of claim 1 wherein the second operation provides a result at an output of the analog converter.

6. The method of claim 1 wherein the counter is enabled to count using a system clock as a reference clock.

7. The method of claim 1 further comprising the steps of:
   programming the register with an add select value;
   enabling the programmable clock signal to remain asserted for a preselected number of clock cycles after the counter equals the high time value; and
   negating the programmable clock signal after the predetermined number of clock cycle.

8. The method of claim 7 wherein the preselected number of clock cycles is equal to one.

9. The method of claim 1 wherein the high time value corresponds to a low time period and the low time value corresponds to a high time period.

10. A data processing system comprising:
    register means for storing a high count value and a low count value;
    a counter having a first input coupled to the register means for receiving one of the high count value and the low count value, the counter having a second input for receiving a system clock signal, the counter counting to provide an intermediate count value in response to the system clock signal;
    a detect circuit coupled to the counter for receiving the intermediate count value, the detect circuit asserting a detect signal when the count value is equal to a preselected count value;
    driver means coupled to the detect circuit for receiving the detect signal, the driver means selectively asserting a converter clock signal in response to the detect signal; and
    an analog converter coupled to the driver means for receiving the converter clock signal, the analog converter performing a conversion operation in response to the converter clock signal.

11. The data processing system of claim 10 wherein the analog converter clock signal is asserted until the intermediate value stored in the counter is equal to the high count value.

12. The data processing system of claim 10 wherein the analog converter clock signal is negated until the intermediate value stored in the counter is equal to the low count value.

13. The data processing system of claim 10 wherein the analog converter performs the comparison operation when the analog converter clock signal is asserted.

14. The data processing system of claim 13 wherein the analog converter outputs a result of the comparison operation when the analog converter clock signal is negated.

15. The data processing system of claim 10 wherein the preselected count value is equal to zero.

16. The data processing system of claim 10 wherein the counter decrements the intermediate count value stored therein in response to the system clock signal.

* * * * *